(12) United States Patent
Lee et al.

(10) Patent No.: US 12,341,522 B2
(45) Date of Patent: Jun. 24, 2025

(54) TRIPLE-PATH CLOCK AND DATA RECOVERY CIRCUIT, OSCILLATOR CIRCUIT AND METHOD FOR CLOCK AND DATA RECOVERY

(71) Applicant: M31 TECHNOLOGY CORPORATION, Hsinchu County (TW)

(72) Inventors: Guo-Hau Lee, Hsinchu (TW); Huai-Te Wang, Hsinchu (TW); Cheng-Liang Hung, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 18/429,890

(22) Filed: Feb. 1, 2024

(65) Prior Publication Data

US 2024/0171180 A1 May 23, 2024

Related U.S. Application Data (62) Division of application No. 18/146,854, filed on Dec. 27, 2022, now Pat. No. 11,936,388, which is a
(Continued)

(51) Int. Cl.
*H03L 7/08* (2006.01)
*H03K 3/037* (2006.01)
(Continued)

(52) U.S. Cl.
CPC .......... *H03L 7/0807* (2013.01); *H03K 3/037* (2013.01); *H03L 7/0893* (2013.01); *H03L 7/091* (2013.01);
(Continued)

(58) Field of Classification Search
CPC ..... H03L 7/0807; H03L 7/0893; H03L 7/091; H03L 7/0992; H03L 7/0995; H03L 7/189; H03K 3/037; H03M 1/38
See application file for complete search history.

(56) References Cited

U.S. PATENT DOCUMENTS 7,990,225 B1 * 8/2011 Guo ................. H03L 7/093
331/185
8,090,755 B1 1/2012 Old
(Continued)

FOREIGN PATENT DOCUMENTS

| CN | 103633998 A | 3/2014 |
|---|---|---|
| CN | 113497620 A | 10/2021 |
| WO | 2004066074 A2 | 8/2004 |

OTHER PUBLICATIONS

English abstract of CN113497620.
(Continued)

*Primary Examiner* — Janice N Tieu
(74) *Attorney, Agent, or Firm* — WPAT, P.C.; Anthony King (57) ABSTRACT

A clock and data recovery circuit includes a sampling circuit, a phase detector, a first processing circuit, a second processing circuit and an oscillator circuit. The sampling circuit is configured to sample input data according to an output clock, and generate a sampling result. The phase detector is configured to generate a detection result according to the sampling result. The first processing circuit is configured to process the sampling result to generate a first digital code. The second processing circuit is configured to accumulate a portion of the first digital code to generate a second digital code. A rate of change of a code value of the second digital code is slower than a rate of change of a code value of the first digital code. The oscillator circuit is configured to generate the output clock according to the
(Continued)

detection result, the first digital code and the second digital code.

20 Claims, 5 Drawing Sheets

Related U.S. Application Data division of application No. 17/355,178, filed on Jun. 23, 2021, now Pat. No. 11,569,822.

(60) Provisional application No. 63/043,068, filed on Jun. 23, 2020.

(51) Int. Cl.
    *H03L 7/089*     (2006.01)
    *H03L 7/091*     (2006.01)
    *H03L 7/099*     (2006.01)
    *H03L 7/189*     (2006.01)
    *H03M 1/38*     (2006.01)

(52) U.S. Cl.
CPC .......... *H03L 7/0992* (2013.01); *H03L 7/0995* (2013.01); *H03L 7/189* (2013.01); *H03M 1/38* (2013.01)

(56) References Cited

U.S. PATENT DOCUMENTS

| | | | |
|---|---|---|---|
| 8,334,725 B2 | 12/2012 | Wang et al. | |
| 8,717,802 B2 | 5/2014 | Lam et al. | |
| 9,413,387 B2 | 8/2016 | Fenney | |
| 9,813,069 B1 | 11/2017 | Chattopadhyay et al. | |
| 10,833,684 B1* | 11/2020 | Bhagwan | H03L 7/0891 |
| 2003/0132806 A1* | 7/2003 | Takenaka | H03L 7/0805 |
| | | | 331/17 |
| 2006/0285619 A1* | 12/2006 | Watanabe | H03L 7/0805 |
| | | | 375/376 |
| 2009/0273405 A1* | 11/2009 | Cowan | H03L 7/0998 |
| | | | 331/109 |
| 2013/0187685 A1 | 7/2013 | Hong et al. | |
| 2015/0288368 A1 | 10/2015 | Yun et al. | |
| 2016/0142061 A1 | 5/2016 | Hung et al. | |
| 2016/0211967 A1 | 7/2016 | Huang et al. | |
| 2019/0372575 A1* | 12/2019 | Wu | H03L 7/0893 |

OTHER PUBLICATIONS

Office action dated Mar. 28, 2024 from corresponding China application 202110695621.6.
Search report dated Mar. 28, 2024 from corresponding China application 202110695621.6.
English abstract translation of CN103633998.

* cited by examiner

TRIPLE-PATH CLOCK AND DATA RECOVERY CIRCUIT, OSCILLATOR CIRCUIT AND METHOD FOR CLOCK AND DATA RECOVERY

PRIORITY CLAIM AND CROSS-REFERENCE

The present application is a divisional application of U.S. patent application Ser. No. 18/146,854 filed on Dec. 27, 2022, which is divisional application of U.S. patent application Ser. No. 17/355,178 filed on Jun. 23, 2021, which claims priority to U.S. Provisional Patent Application No. 63/043,068, filed on Jun. 23, 2020, each of which is incorporated by reference herein in its entirety.

BACKGROUND

The present disclosure relates to clock and data recovery (CDR) and, more particularly, to a clock and data recovery circuit having a triple-path structure for bandwidth tracking, and a related oscillator circuit and method for clock and data recovery.

With the use of clock and data recovery (CDR) techniques, a receiver can retrieve data from a data stream transmitted without additional timing information. Firstly, the receiver may perform clock recovery to extract a clock signal embedded in level transitions in the data stream. Next, the receiver can phase-align the clock signal to the level transitions in the data stream, and recover the data from the data stream by sampling the data stream according to the phase-aligned clock signal. For example, CDR circuits have been widely used in high-speed serial interfaces to regenerate a data stream according to a high speed clock signal, which is phase-aligned to level transitions in the data stream. CDR circuits may face several challenges. For example, an oscillator circuit of a CDR circuit may suffer from large jitter resulting from process variations, temperature variations, and/or timing uncertainties in high-speed data transmission.

SUMMARY

The described embodiments provide a clock and data recovery circuit having a triple-path structure for bandwidth tracking, and a related oscillator circuit and method for clock and data recovery.

Some embodiments described herein may include a clock and data recovery (CDR) circuit. The CDR circuit includes a sampling circuit, a phase detector, a first processing circuit, a second processing circuit and an oscillator circuit. The sampling circuit is configured to sample input data according to an output clock and accordingly generate a sampling result. The phase detector, coupled to the sampling circuit, is configured to generate a detection result according to the sampling result. The first processing circuit, coupled to the sampling circuit, is configured to process the sampling result to generate a first digital code. The second processing circuit, coupled to the first processing circuit, is configured to accumulate a portion of the first digital code to generate a second digital code. A rate of change of a code value of the second digital code is slower than a rate of change of a code value of the first digital code. The oscillator circuit, coupled to the sampling circuit, the phase detector, the first processing circuit and the second processing circuit, is configured to generate the output clock according to the detection result, the first digital code and the second digital code. A phase of the output clock is adjusted at least according to the detection result, and a frequency of the output clock is adjusted according to the first digital code and the second digital code.

Some embodiments described herein may include an oscillator circuit. The oscillator circuit includes a current-controlled oscillator, a first conversion circuit, a second conversion circuit and a third conversion circuit. The current-controlled oscillator is configured to generate an output clock according to a first control current, a second control current and a third control current. A frequency of the output clock is controlled by the first control current and the second control current, and a phase of the output clock is controlled by the third control current. The first conversion circuit, coupled to the current-controlled oscillator, is configured to convert a first digital code to the first control current according to a first reference current. The second conversion circuit, coupled to the current-controlled oscillator and the first conversion circuit, is configured to convert a second digital code to the second control current, the first reference current and a second reference current. The second digital code is an accumulation result of at least one most significant bit of the first digital code. The third conversion circuit, coupled to the current-controlled oscillator and the first conversion circuit, is configured to convert a third digital code and the second reference current to the third control current.

Some embodiments described herein may include a method for clock and data recovery (CDR). The method includes: generating a data signal and an edge signal by sampling input data according to an output clock outputted from an oscillator, the data signal and the edge signal carrying phase error information on a phase error between the input data and the output clock; generating a detection result according to the data signal and the edge signal, the detection result indicating a phase relationship between the input data and the output clock; accumulating the phase error information carried by the data signal and the edge signal to generate a first digital code; accumulating at least one most significant bit of the first digital code to generate a second digital code; adjusting a phase of the output clock according to the detection result and the second digital code; and adjusting a frequency of the output clock according to the first digital code and the second digital code.

With the use of the proposed CDR scheme, an oscillator circuit in a CDR circuit can not only have a wide tuning range but also high resolution despite temperature variations. In addition, the proposed CDR scheme can achieve bandwidth tracking at various frequency corners, thereby ensuring good loop stability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

To ensure loop stability despite temperature variations, a clock and data recovery (CDR) circuit may utilize an oscillator circuit with a wide tuning range. For example, the oscillator circuit may be designed to have a large frequency step to thereby widen a tuning range thereof. However, the large frequency step results in large jitter outputted from the oscillator circuit.

The present disclosure describes exemplary CDR circuits, each of which can employ a triple-path structure for controlling operation of an oscillator circuit. The oscillator circuit is included in the exemplary CDR circuit, and configured to generate an output clock for recovering data from a data stream. Two circuit paths of the triple-path structure can perform coarse tuning and fine tuning on a frequency of the output clock, respectively. In some embodiments, one of the two circuit paths is configured to receive a digital code to perform the fine tuning, and the other of the two circuit paths is configured to receive an accumulation result of a portion of the digital code to perform the coarse tuning. Additionally, or alternatively, the triple-path structure can achieve bandwidth tracking with the use of the circuit path used for the coarse tuning. The present disclosure further describes exemplary oscillator circuits, each of which can not only have a wide tuning range but also high resolution. Related methods for CDR are also described in the present disclosure. Further description is provided below.

Figure 1:
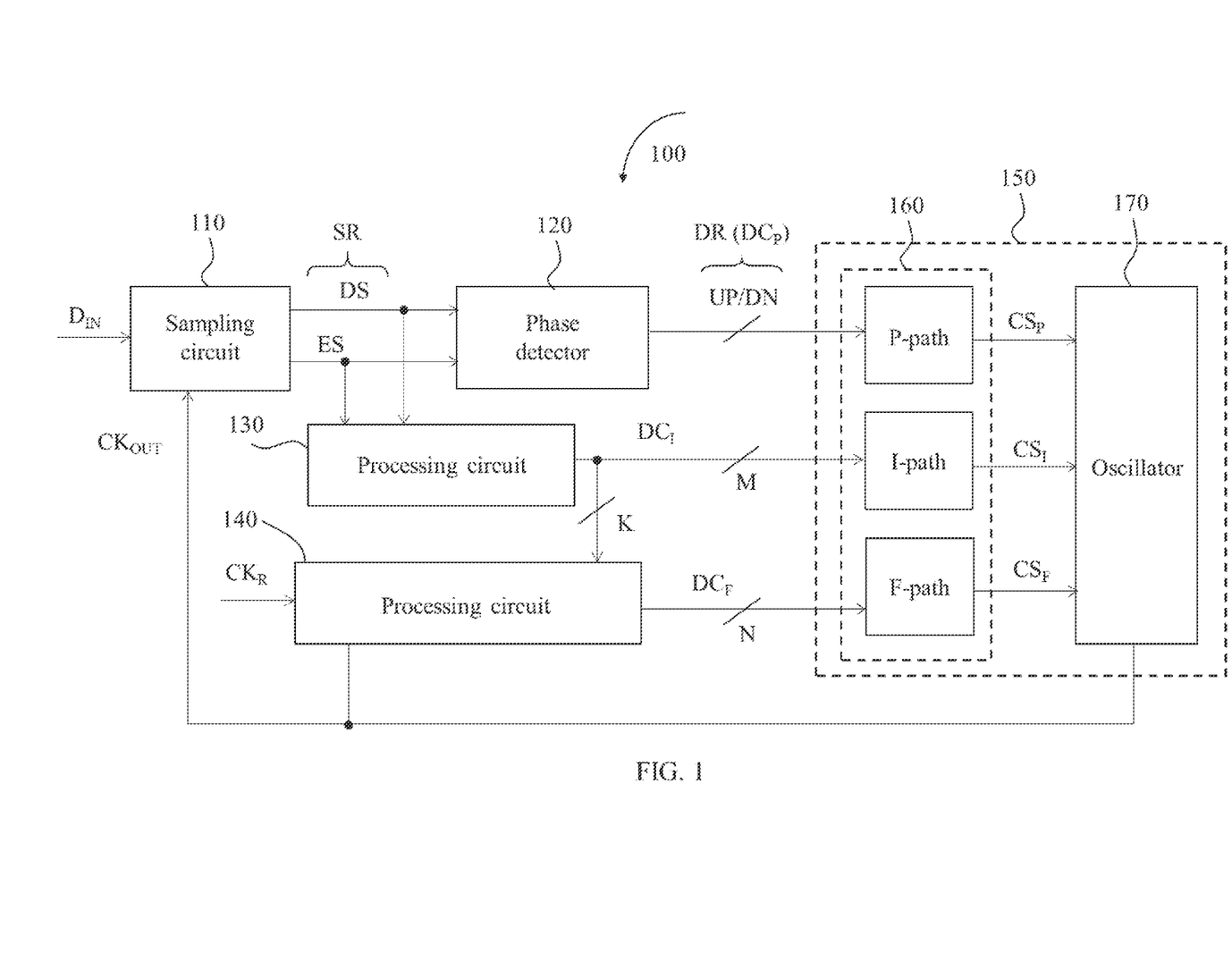
FIG. 1 is a block diagram illustrating an exemplary clock and data recovery circuit in accordance with some embodiments of the present disclosure.

FIG. 1 is a block diagram illustrating an exemplary CDR circuit in accordance with some embodiments of the present disclosure. The CDR circuit 100 can be configured to recover timing information carried by input data $D_{IN}$, such as a data stream, and regenerate the input data $D_{IN}$ according to the recovered timing information. The CDR circuit 100 includes, but is not limited to, a sampling circuit 110, a phase detector (PD) 120, a plurality of processing circuits 130 and 140, and an oscillator circuit 150. In the present embodiment, the CDR circuit 100 may employ a triple-loop structure. For example, the sampling circuit 110 may be used together with the PD 120 and the oscillator circuit 150 to implement a phase tracking loop. The sampling circuit 110 may be used together with the processing circuit 130 and the oscillator circuit 150 to implement a frequency tracking loop. Also, the sampling circuit 110 may be used together with the processing circuit 130, the processing circuit 140 and the oscillator circuit 150 to implement another frequency tracking loop.

The sampling circuit 110 is configured to sample the input data $D_{IN}$ according to an output clock $CK_{OUT}$, and accordingly generate a sampling result SR. In the present embodiment, the sampling circuit 110 may sample data bits of the input data $D_{IN}$ and a data edge in between two consecutive data bits according to the output clock $CK_{OUT}$, and accordingly generate a data signal DS and an edge signal ES. As a result, the data signal DS and the edge signal ES can carry phase error information on a phase error between the input data $D_{IN}$ and the output clock $CK_{OUT}$. By way of example but not limitation, the sampling circuit 110 may perform two-times ($2x$) oversampling on the input data $D_{IN}$ to generate the sampling result SR.

The PD 120, coupled to the sampling circuit 110, is configured to generate a detection result DR according to the sampling result SR. The detection result DR may indicate whether the output clock $CK_{OUT}$ lags or leads the input data $D_{IN}$. In the present embodiment, the PD 120 may receive the data signal DS and the edge signal ES to detect a difference in phase between the input data $D_{IN}$ and the output clock $CK_{OUT}$. The detection result DR may include an up signal UP and a down signal DN to indicate whether the output clock $CK_{OUT}$ lags or leads the input data $D_{IN}$. For example, the PD 120 may generate the up signal UP with a predetermined logic level when the output clock $CK_{OUT}$ lags the input data $D_{IN}$, and generate the down signal DN with a predetermined logic level when the output clock $CK_{OUT}$ leads the input data $D_{IN}$. In some embodiments, the detection result DR may be implemented using a digital code $DC_P$ which includes the up signal UP and the down signal DN.

The processing circuit 130, coupled to the sampling circuit 110, is configured to process the sampling result SR to generate a digital code $DC_I$, which can indicate information on a frequency error between the input data $D_{IN}$ and the output clock $CK_{OUT}$. In the present embodiment, the digital code $DC_I$ is implemented as an M-bit digital signal, where M is an integer greater than one.

The processing circuit 140, coupled to the processing circuit 130, is configured to accumulate a portion of the digital code $DC_I$ to generate a digital code $DC_F$. A rate of change of a code value of the digital code $DC_F$ can be slower than a rate of change of a code value of the digital code $DC_I$. For example, the portion of the digital code $DC_I$ may be K bits of the digital code $DC_I$, where K is a positive integer less than M. As another example, the portion of the digital code $DC_I$ may be the most significant bit (MSB) of the digital code $DC_I$. As another example, the portion of the digital code $DC_I$ may be the first two MSBs of the digital code $DC_I$. As still another example, the portion of the digital code $DC_I$ may be at least one MSB of the digital code $DC_I$. In the present embodiment, the digital code $DC_F$ can indicate information on the frequency error between the input data $D_{IN}$ and the output clock $CK_{OUT}$ since the digital code $DC_F$ is an accumulation result of the portion of the digital code $DC_I$. The digital code $DC_F$ can be implemented as an N-bit digital signal, where N is a positive integer.

The oscillator circuit 150, coupled to the sampling circuit 110, the PD 120, the processing circuit 130 and the processing circuit 140, is configured to generate the output clock $CK_{OUT}$ according to the detection result DR, the digital code $DC_I$ and the digital code $DC_F$. A phase of the output clock $CK_{OUT}$ is adjusted at least according to the detection result DR, and a frequency of the output clock $CK_{OUT}$ is adjusted according to the digital code $DC_I$ and the digital code $DC_F$. In some embodiments where the detection result DR is implemented using the digital code $DC_P$, the oscillator circuit 150 can be implemented as a digitally-controlled oscillator (DCO) circuit. Additionally, or alternatively, as the rate of change of the code value of the digital code $DC_F$ can be slower than that of the code value of the digital code $DC_I$, the digital code $DC_F$ can be regarded as a control input for coarse tuning of the frequency of the output clock $CK_{OUT}$, and the digital code $DC_I$ can be regarded as a control input for fine tuning of the frequency of the output clock $CK_{OUT}$.

In the present embodiment, the oscillator circuit 150 includes, but is not limited to, a control circuit 160 and an oscillator 170. The control circuit 160, coupled to the PD 120, the processing circuit 130 and the processing circuit 140, may utilize a triple-path structure to control operation of the oscillator 170. For example, the control circuit 160 is configured to generate a control signal $CS_P$ at least according to the detection result DR, generate a control signal $CS_I$ at least according to the digital code $DC_I$, and generate a control signal $CS_F$ according to the digital code $DC_F$. The control signal $CS_P$, generated from one path in the control circuit 160, is sent to the oscillator 170 to adjust the phase of the output clock $CK_{OUT}$. The control signals $CS_I$ and $CS_F$, generated from other two paths in the control circuit 160, are sent to the oscillator 170 to adjust the frequency of the output clock $CK_{OUT}$. An increase in a signal level of the control signal $CS_F$, generated when the code value of the digital code $DC_F$ is incremented by a predetermined amount such as a binary 1, is greater than an increase in a signal level in the control signal $CS_I$, generated when the code value of the digital code $DC_I$ is incremented by the predetermined amount. As a result, the control signal $CS_F$ can be used for coarse tuning of the frequency of the output clock $CK_{OUT}$, and the control signal $CS_I$ can be used for fine tuning of the frequency of the output clock $CK_{OUT}$.

The oscillator 170, coupled to the sampling circuit 110 and the control circuit 160, is configured to generate the output clock $CK_{OUT}$ according to the control signal $CS_P$, the control signal $CS_I$ and the control signal $CS_F$. The oscillator 170 may be implemented using a current-controlled oscillator (CCO), a voltage-controlled oscillator (VCO) or a hybrid current/voltage-controlled oscillator.

In operation, the sampling circuit 110 may oversample the input data $D_{IN}$ according to the output clock $CK_{OUT}$, and accordingly generate the data signal DS and the edge signal ES. The PD 120 may output the up signal UP and the down signal DN according to whether the output clock $CK_{OUT}$ lags or leads the input data $D_{IN}$. The control circuit 160 may utilize the up signal UP and the down signal DN to generate the control signal $CS_P$ to thereby adjust the phase of the output clock $CK_{OUT}$. A circuit path associated with generation of the control signal $CS_P$ can be referred to as a proportional path (denoted as P-path). The processing circuit 130 may process the sampling result SR to accumulate the phase error information carried by the data signal DS and the edge signal ES, thereby producing the digital code $DC_I$ which indicates the information on the frequency error between the input data $D_{IN}$ and the output clock $CK_{OUT}$. The control circuit 160 may utilize the digital code $DC_I$ to generate the control signal $CS_I$ to thereby adjust the frequency of the output clock $CK_{OUT}$. A circuit path associated with generation of the control signal $CS_I$ can be referred to as an integral path (denoted as I-path). In addition, the processing circuit 140 may accumulate at least one MSB of the digital code $DC_I$ to produce the digital code $DC_F$. The control circuit 160 may utilize the digital code $DC_F$ to generate the control signal $CS_F$ to thereby adjust the frequency of the output clock $CK_{OUT}$. A circuit path associated with generation of the control signal $CS_F$ is denoted as F-path.

As the code value of the digital code $DC_F$ changes more slowly than the code value of the digital code $DC_I$, the control circuit 160 may utilize the digital code $DC_F$ to coarse tune the frequency of the output clock $CK_{OUT}$, and utilize the digital code $DC_I$ to fine tune the frequency of the output clock $CK_{OUT}$. For example, when the code value of the digital code $DC_F$ is unchanged and the code value of the digital code $DC_I$ increases, the signal level of the control signal $CS_I$ increases. The frequency of the output clock $CK_{OUT}$ can be adjusted using a fine step size. When the code value of the digital code $DC_F$ increases, the signal level of the control signal $CS_F$ increases. The frequency of the output clock $CK_{OUT}$ can be adjusted using a coarse step size.

It is worth noting that, with the use of the proposed CDR scheme, the gain associated with the integral path of the control circuit 160 can be kept small to provide high frequency resolution. In addition, the coarse tuning implemented using the processing circuit 140 can provide a large frequency step size and therefore allow the oscillator circuit 150 to have a wide tuning range. Moreover, the control circuit 160 may generate the control signal $CS_P$ according to the detection result DR and the digital code $DC_F$. By adjusting respective signal levels of the control signals $CS_P$, $CS_I$ and $CS_F$ according to the digital code $DC_F$, the control circuit 160 can allow each of the control signal $CS_P$ generated from the P-path and the control signal $CS_I$ generated from the I-path to track the control signal $CS_F$ generated from the F-path, thereby achieving bandwidth tracking at various frequency corners.

In some embodiments, before the CDR circuit 100 starts to track the input data $D_{IN}$, the processing circuit 140 can be configured to compare a frequency of a reference clock $CK_R$ with the frequency of the output clock $CK_{OUT}$, and accordingly set the code value of the digital code $DC_F$ to a predetermined value. When the CDR circuit 100 starts to track the input data $D_{IN}$, the processing circuit 140 can accumulate the portion of the digital code $DC_I$ to update the code value of the digital code $DC_F$. With the use of the predetermined value, the CDR circuit 100 can shorten a period of time it takes to lock the output clock $CK_{OUT}$.

To facilitate understanding of the present disclosure, some embodiments are given as follows for further description of the proposed CDR scheme. Those skilled in the art should appreciate that other embodiments employing the architecture shown in FIG. 1 are also within the contemplated scope of the present disclosure.

Figure 2:
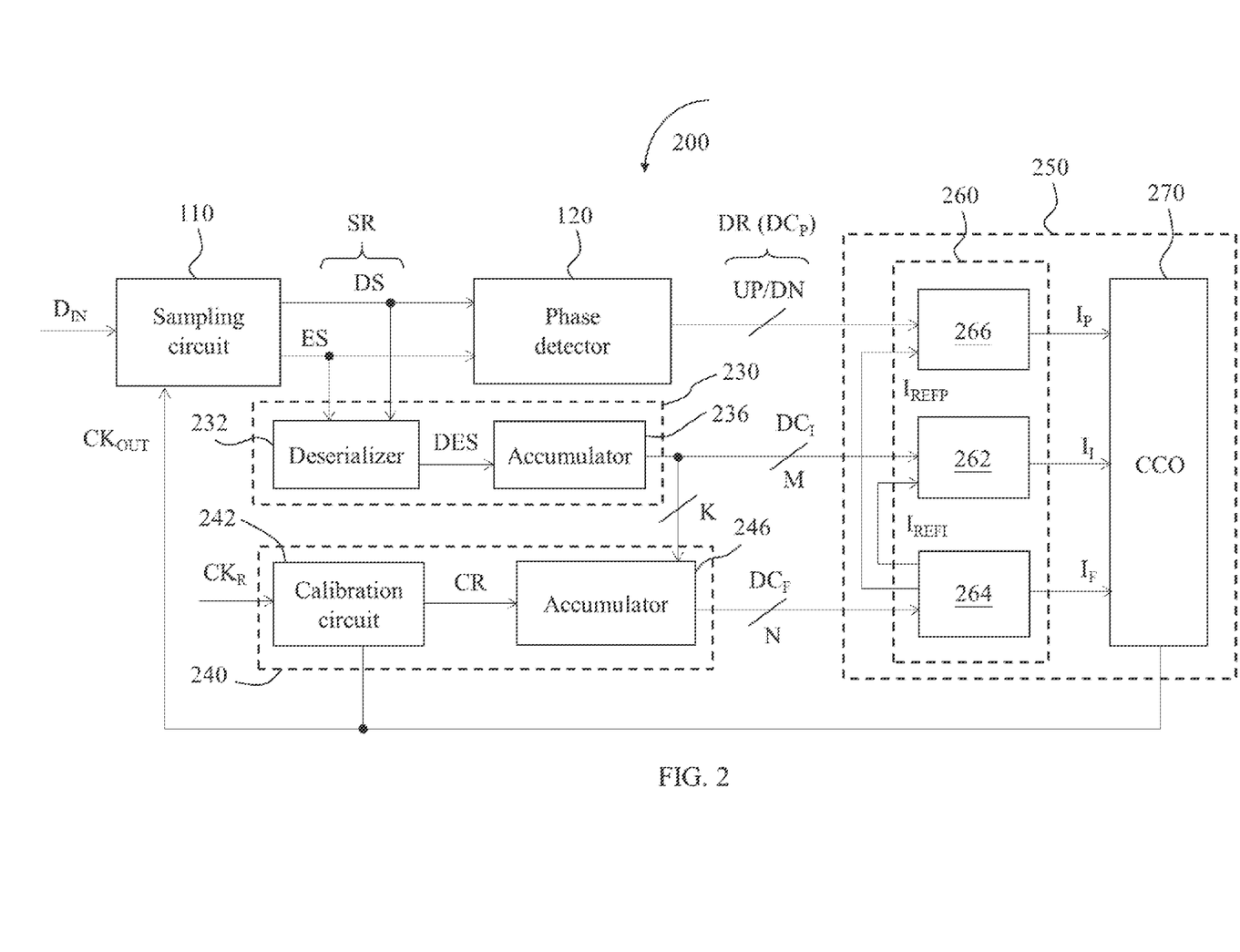
FIG. 2 illustrates an implementation of the clock and data recovery circuit shown in FIG. 1 in accordance with some embodiments of the present disclosure.

FIG. 2 illustrates an implementation of the CDR circuit 100 shown in FIG. 1 in accordance with some embodiments of the present disclosure. The CDR circuit 200 includes, but is not limited to, the sampling circuit 110 and the PD 120 shown in FIG. 1, a plurality of processing circuits 230 and 240, and an oscillator circuit 250. The processing circuits 230 and 240 can represent embodiments of the processing circuits 130 and 140 shown in FIG. 1, respectively. The oscillator circuit 250 can represent an embodiment of the oscillator circuit 150 shown in FIG. 1.

The processing circuit 230 includes, but is not limited to, a deserializer 232 and an accumulator 236. The deserializer 232, coupled to the sampling circuit 110, is configured to process the data signal DS and the edge signal ES to generate a deserialization result DES. The deserialization result DES can indicate the phase error information on the phase error between the input data $D_{IN}$ and the output clock $CK_{OUT}$. The accumulator 236, coupled to the deserializer 232, is configured to accumulate the phase error information indicated by the deserialization result DES to generate the digital code $DC_I$.

The processing circuit 240 includes, but is not limited to, a calibration circuit 242 and an accumulator 246. The calibration circuit 242, coupled to the oscillator circuit 250, is configured to compare the frequency of the reference clock $CK_R$ with the frequency of the output clock $CK_{OUT}$ to generate a calibration result CR. The accumulator 246, coupled to the calibration circuit 242, is configured to set the code value of the digital code $DC_F$ according to the calibration result CR, and accumulate a portion of the digital code $DC_I$ to update the code value of the digital code $DC_F$ after the code value of the digital code $DC_F$ is set according to the calibration result CR.

The oscillator circuit 250 includes, but is not limited to, a control circuit 260 and a current-controlled oscillator (CCO) 270. The control circuit 260 is configured to generate a control current $I_I$ at least according to the digital code $DC_I$, generate a control current $I_F$ according to the digital code $DC_F$, and generate a control current $I_P$ at least according to the digital code $DC_P$ (i.e. the detection result DR outputted from the PD 120). The control currents $I_P$, $I_I$ and $I_F$ can represent embodiments of the control signals $CS_P$, $CS_I$ and $CS_F$ shown in FIG. 1, respectively. An increment in the control current $I_F$, generated when the code value of the digital code $DC_F$ is incremented by a predetermined amount such as binary 1, is greater than an increment in the control current $I_I$, generated when the code value of the digital code $DC_I$ is incremented by the predetermined amount. As a result, the control current $I_F$ can be used for coarse tuning of the frequency of the output clock $CK_{OUT}$, and the control current $I_I$ can be used for fine tuning of the frequency of the output clock $CK_{OUT}$.

In the present embodiment, the control circuit 260 can be configured to generate the control current $I_I$ according to the digital code $DC_I$ and the digital code $DC_F$, and generate the control current $I_P$ according to the digital code $DC_P$ and the digital code $DC_F$. As a result, the control circuit 260 can allow each of the control current $I_P$ and the control current $I_I$ to track the control current $I_F$, thus achieving bandwidth tracking and ensure good loop stability. For example, the control circuit 260 may include a plurality of conversion circuits 262, 264 and 266, which can be used to implement the P-path, the I-path and the F-path shown in FIG. 1, respectively. The control circuit 260 may allow at least one of the control current $I_I$ generated from the conversion circuit 262 and the control current $I_P$ generated from the conversion circuit 266 to track the control current $I_F$ generated from the conversion circuit 264.

The conversion circuit 262, coupled to the processing circuit 230, is configured to generate the control current $I_I$ according to the digital code $DC_I$ and a reference current $I_{REFI}$. For example, the conversion circuit 262 is configured to convert the digital code $DC_I$ to the control current $I_I$ according to the reference current $I_{REFI}$. A current level of the control current $I_I$ changes in response to a current level of the reference current $I_{REFI}$ when the code value of the digital code $DC_I$ is kept unchanged.

The conversion circuit 264, coupled to the processing circuit 240 and the conversion circuit 262, is configured to generate the control current $I_F$ and the reference current $I_{REFI}$ according to the digital code $DC_F$. For example, the conversion circuit 264 is configured to convert the digital code $DC_F$, i.e. an accumulation result of a portion of the digital code $DC_I$, to the control current $I_F$ and the reference current $I_{REFI}$. When the code value of the digital code $DC_F$ increases, each of the control current $I_F$ and the reference current $I_{REFI}$ may increase. In the present embodiment, the conversion circuit 264 is further configured to convert the digital code $DC_F$ to a reference current $I_{REFP}$. Respective current levels of the reference currents $I_{REFI}$ and $I_{REFP}$ can change in response to a current level of the control current $I_F$ when the code value of the digital code $DC_F$ is kept unchanged. In other words, each of the reference currents $I_{REFI}$ and $I_{REFP}$, coming from the conversion circuit 264, can track the control current $I_F$. For example, when the code value of the digital code $DC_F$ increases, each of the reference current $I_{REFI}$ and the reference current $I_{REFP}$ may increase.

The conversion circuit 266, coupled to the PD 120 and the conversion circuit 264, is configured to convert the digital code $DC_P$ and the reference current $I_{REFP}$ to the control current $I_P$. For example, the conversion circuit 266 can be configured to generate the control current $I_P$ by selectively steering the reference current $I_{REFP}$ from the conversion circuit 264 to the CCO 270 according to the digital code $DC_P$. A current level of the control current $I_P$ changes in response to a current level of the reference current $I_{REFP}$ when the code value of the digital code $DC_P$ is kept unchanged.

The CCO 270, coupled to the conversions circuit 262, 264 and 266, is configured to generate the output clock $CK_{OUT}$ according to the control currents $I_P$, $I_I$ and $I_F$. In the present embodiment, the frequency of the output clock $CK_{OUT}$ is controlled by the control current $I_I$ and the control current $I_F$, and the phase of the output clock $CK_{OUT}$ is controlled by the control current $I_P$.

In operation, before the CDR circuit 200 starts to track the input data $D_{IN}$, the calibration circuit 242 may be activated to generate the calibration result CR by comparing the frequency of the reference clock $CK_R$ with the frequency of the output clock $CK_{OUT}$. The accumulator 246 may set the code value of the digital code $DC_F$ to a predetermined value according to the calibration result CR. After the CDR circuit 200 starts to track the input data $D_{IN}$, the calibration circuit 242 may be deactivated. The sampling circuit 110 may oversample the input data $D_{IN}$ according to the output clock $CK_{OUT}$, and accordingly generate the data signal DS and the edge signal ES.

With regard to frequency tracking loops, the deserializer 232 may convert the data signal DS and the edge signal ES in serial form into the deserialization result DES which is in parallel form. The accumulator 236 may accumulate the phase error information indicated by the deserialization result DES to produce the digital code $DC_I$, which indicates the information on the frequency error between the input data $D_{IN}$ and the output clock $CK_{OUT}$. The accumulator 246 may accumulate the portion of the digital code $DC_I$ from the predetermined value to update the code value of the digital code $DC_F$.

In addition, the conversion circuit 264 may generate the control current $I_F$ and the reference current $I_{REFI}$ according to the digital code $DC_F$. The conversion circuit 262 may convert the digital code $DC_I$ to the control current $I_I$ according to the reference current $I_{REFI}$ provided by the conversion circuit 264. When the code value of the digital code $DC_F$ increases, the control current $I_F$ increases. When a code value of another portion of the digital code $DC_I$ increases, the control current $I_I$ increases. For example, the accumulator 246 updates the digital code $DC_F$ by accumulating at least one MSB of the digital code $DC_I$ from the predetermined value. The another portion of the digital code $DC_I$ may be at least one least significant bit (LSB) of the digital code $DC_I$ which is not accumulated by the accumulation 246. When the code value of the digital code $DC_F$ is unchanged, and the code value of the another portion of the digital code $DC_I$ increases, it means that the control circuit 260 fine tunes the frequency of the output clock $CK_{OUT}$. The control current $I_I$ increases in response to the code value of the digital code $DC_I$. The frequency of the output clock $CK_{OUT}$ can be adjusted using a fine step size. When the code value of the digital code $DC_F$ changes or increases, it means that the control circuit 260 coarse tunes the frequency of the output clock $CK_{OUT}$. The control current $I_F$ may increase accordingly. The frequency of the output clock $CK_{OUT}$ can be adjusted using a coarse step size.

With regard to a phase tracking loop, the PD 120 may output the up signal UP and the down signal DN according to the data signal DS and the edge signal ES. The conversion circuit 266 may convert the digital code $DC_P$ and the reference current $I_{REFP}$, provided by the conversion circuit 264, to the control current $I_P$. For example, when the digital code $DC_P$ has a predetermined code value, the conversion circuit 266 is configured to increase the control current $I_P$ by steering the reference current $I_{REFP}$ from the conversion circuit 264 to the CCO 270. When the digital code $DC_P$ has another predetermined code value, the conversion circuit 266 is configured to decrease the control current $I_P$ by stopping steering the reference current $I_{REFP}$ to the CCO 270. The phase of the output clock $CK_{OUT}$ can be adjusted according to the control current $I_P$.

The above circuit structures are provided for illustrative purposes, and are not intended to limit the scope of the present disclosure. In some embodiments, the calibration circuit 242 may be optional. In some embodiments, the oscillator circuit 250 may be implemented using a VCO circuit or a hybrid current/voltage-controlled oscillator circuit. Such modifications and alternatives also fall within the contemplated scope of the present disclosure.

Figure 3:
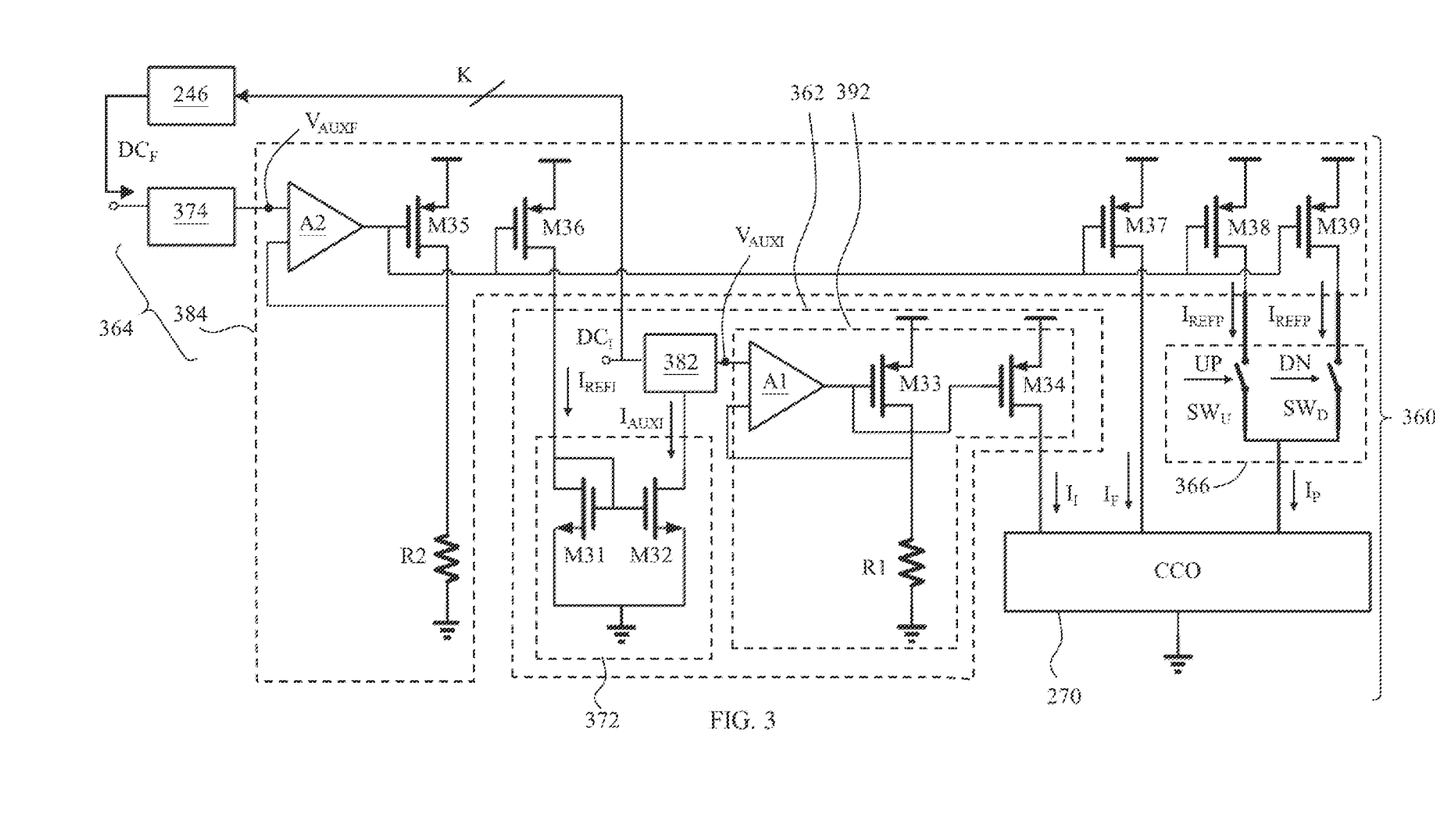
FIG. 3 illustrates an implementation of the control circuit shown in FIG. 2 in accordance with some embodiments of the present disclosure.

FIG. 3 illustrates an implementation of the control circuit 260 shown in FIG. 2 in accordance with some embodiments of the present disclosure. The control circuit 360 includes a plurality of conversion circuits 362, 364 and 366, which represent embodiments of the conversion circuits 262, 264 and 266 shown in FIG. 2, respectively. In the present embodiment, the conversion circuit 362 includes, but is not limited to, a current mirror circuit 372, a digital-to-analog converter (DAC) 382 and a voltage-to-current converter 392. The current mirror circuit 372 can be configured to mirror the reference current $I_{REFI}$ to generate an auxiliary current $I_{AUXI}$. By way of example but not limitation, the current mirror circuit 372 may include a plurality of transistors M31 and M32. The DAC 382, coupled to the current mirror circuit 372, can be configured to convert the digital code $DC_I$ to an auxiliary voltage $V_{AUXI}$ according to the auxiliary current $I_{AUXI}$. The voltage-to-current converter 392, coupled to the DAC 382, can be configured to convert the auxiliary voltage $V_{AUXI}$ to the control current $I_I$. By way of example but not limitation, the voltage-to-current converter 392 may include an amplifier A1, a resistor R1 and a plurality of transistors M33 and M34.

The conversion circuit 364 includes, but is not limited to, a DAC 374 and a voltage-to-current converter 384. The DAC 374 can be configured to convert the digital code $DC_F$ to an auxiliary voltage $V_{AUXF}$. The voltage-to-current converter 384, coupled to the DAC 374, can be configured to convert the auxiliary voltage $V_{AUXF}$ to the reference current $I_{REFF}$, the reference current $I_{REFF}$ and the control current $I_F$. By way of example but not limitation, the voltage-to-current converter 384 may include an amplifier A2, a resistor R2 and a plurality of transistors M35-M39.

The conversion circuit 366 includes, but is not limited to, a plurality of switches $SW_U$ and $SW_D$. The switches $SW_U$ and $SW_D$ can be controlled by the up signal UP and the down signal DN provided by the PD 120 shown in FIG. 2, respectively. As those skilled in the art can appreciate the generation of the control currents $I_P$, $I_I$ and $I_F$ after reading the above paragraphs directed to FIG. 1 and FIG. 2, further description is omitted here for brevity.

Figure 4:
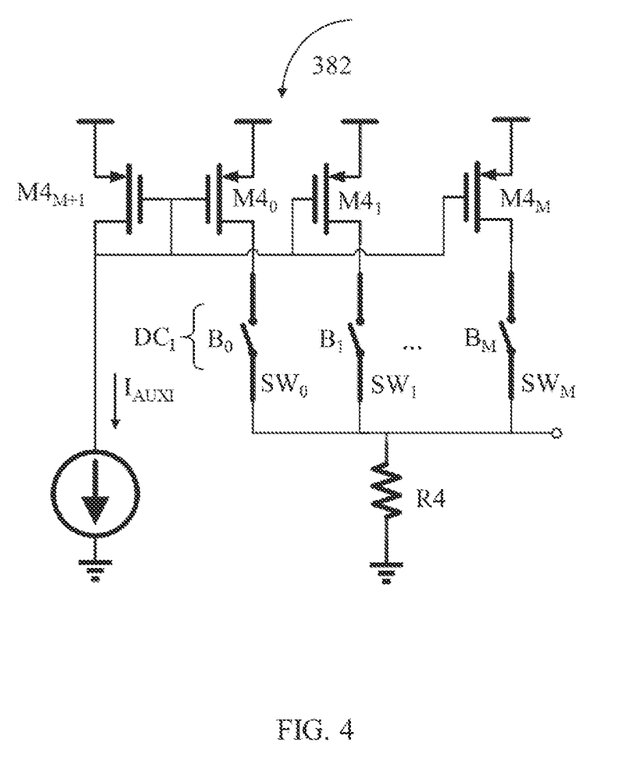
FIG. 4 illustrates an implementation of the digital-to-analog converter shown in FIG. 3 in accordance with some embodiments of the present disclosure.

FIG. 4 illustrates an implementation of the DAC 382 shown in FIG. 3 in accordance with some embodiments of the present disclosure. The DAC 382 is configured to convert the digital code $DC_I$, implemented as an M-bit digital signal, to the auxiliary voltage $V_{AUXI}$ according to the auxiliary current $I_{AUXI}$. In the present embodiment, the DAC 382 includes a plurality of transistors $M4_0$-$M4_M$+1, a plurality of switches $SW_0$-$SW_M$, and a resistor R4. The switches $SW_0$-$SW_M$ are controlled by M bits B0-BM of the digital code $DC_I$. As a result, a voltage level of the auxiliary voltage $V_{AUXI}$ can be determined according to the number of switches which are turned on. In some embodiments, the DAC 374 shown in FIG. 3 may employ a circuit structure similar to that of the DAC 382 shown in FIG. 4.

It is worth noting that the above circuit implementations shown in FIG. 3 and FIG. 4 are provided for illustrative purposes, and are not intended to limit the scope of the present disclosure. As long as a control circuit employs a triple-path structure, which accumulates a digital code for fine frequency tuning and accumulates a portion of the digital code for coarse frequency tuning, to control operation of an oscillator, associated modifications and alternatives fall within the contemplated scope of the present disclosure. Additionally, or alternatively, as long as a control circuit employs a triple-path structure, which allows respective control signals provided by a proportional path and an integral path to track a control signal provided by another path used for coarse frequency tuning, to control operation of an oscillator, associated modifications and alternatives fall within the contemplated scope of the present disclosure.

Figure 5:
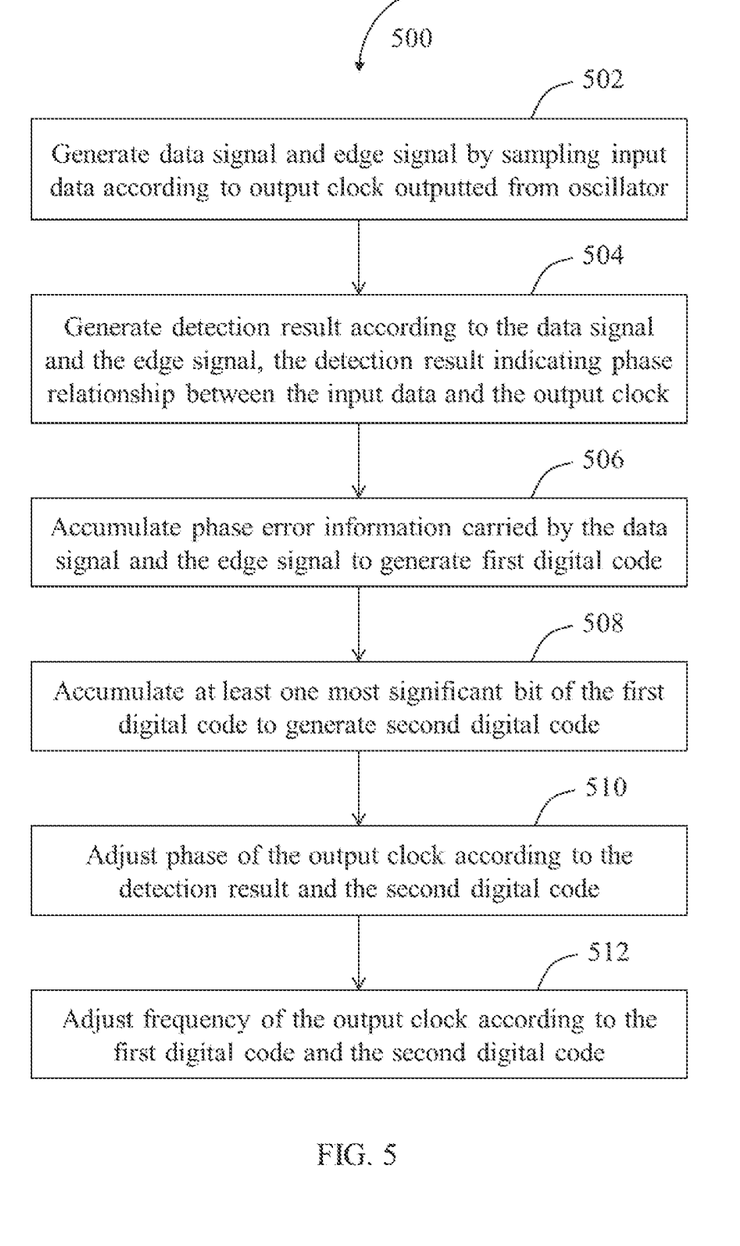
FIG. 5 is a flow chart of an exemplary method for clock and data recovery in accordance with some embodiments of the present disclosure.

FIG. 5 is a flow chart of an exemplary method for clock and data recovery (CDR) in accordance with some embodiments of the present disclosure. The method 500 is described with reference to the CDR circuit 200 shown in FIG. 2 for illustrative purposes. Those skilled in the art should appreciate that the method 500 can be employed in the CDR circuit 100 shown in FIG. 1 or other CDR circuits having triple-path structure without departing from the scope of the present disclosure. Additionally, in some embodiments, other operations in the method 500 can be performed. In some embodiments, operations of the method 500 can be performed in a different order and/or vary. In some other embodiments, one or more operations of the method 500 may be optional.

At operation 502, a data signal and an edge signal are generated by sampling input data according to an output clock outputted from an oscillator. The data signal and the edge signal carry phase error information on a phase error between the input data and the output clock. For example, the sampling circuit 110 can generate the data signal DS and edge signal ES by sampling the input data $D_{IN}$ according to the output clock $CK_{OUT}$ outputted from the CCO 270. The data signal DS and the edge signal ES can carry phase error information on a phase error between the input data $D_{IN}$ and the output clock $CK_{OUT}$.

At operation 504, a detection result is generated according to the data signal and the edge signal. The detection result indicates a phase relationship between the input data and the output clock. For example, the PD 120 can generate the detection result DR according to the data signal DS and edge signal ES, wherein the detection result DR, including the up signal UP and the down signal DN, can indicate a phase relationship between the input data $D_{IN}$ and the output clock $CK_{OUT}$.

At operation 506, the phase error information, carried by the data signal and the edge signal, is accumulated to generate a first digital code. For example, the deserializer 232 can process the data signal DS and the edge signal ES in serial form to generate the deserialization result DES in parallel form, wherein the deserialization result DES can indicate the phase error information on the phase error between the input data $D_{IN}$ and the output clock $CK_{OUT}$. The accumulator 236 can accumulate the phase error information indicated by the deserialization result DES to generate the digital code $DC_I$.

At operation 508, at least one MSB of the first digital code is accumulated to generate a second digital code. For example, the accumulator 246 can accumulate one or more MSBs of the digital code $DC_I$ to generate the digital code $DC_F$.

At operation 510, a phase of the output clock is adjusted according to the detection result and the second digital code. For example, the control circuit 260 can adjust the phase of the output clock $CK_{OUT}$ according to the detection result DR and the digital code $DC_F$.

At operation 512, a frequency of the output clock is adjusted according to the first digital code and the second digital code. For example, the control circuit 260 can adjust the frequency of the output clock $CK_{OUT}$ according to the digital code $DC_I$ and the digital code $DC_F$. It is worth noting that as the phase and the frequency of the output clock $CK_{OUT}$ can be adjusted according to the digital code $DC_F$, the CDR circuit 200 can achieve bandwidth tracking and provide good loop stability.

In some embodiment, at operation 508, an initial value of the second digital code can be determined according to a reference clock and the output clock, which can shorten a period of time it takes to lock the output clock. For example, before the CDR circuit 200 starts to track the input data $D_{IN}$, the calibration circuit 242 may compare the frequency of the reference clock $CK_R$ with the frequency of the output clock $CK_{OUT}$ to generate the calibration result CR. Next, the accumulator 246 may set the code value of the digital code $DC_F$ according to the calibration result CR. After the code value of the digital code $DC_F$ is set according to the calibration result CR, the accumulator 246 may update the code value of the digital code $DC_F$ by accumulating the one or more MSBs of the digital code $DC_I$.

As those skilled in the art can appreciate operation of the method 500 after reading the above paragraphs directed to FIG. 1 through FIG. 4, further description is omitted here for brevity.

With the use of the proposed CDR scheme, an oscillator circuit in a CDR circuit can not only have a wide tuning range but also high resolution despite temperature variations. In addition, the proposed CDR scheme can achieve bandwidth tracking at various frequency corners, thereby ensuring good loop stability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An oscillator circuit, comprising:
a current-controlled oscillator, configured to generate an output clock according to a first control current, a second control current and a third control current, wherein a frequency of the output clock is controlled by the first control current and the second control current, and a phase of the output clock is controlled by the third control current;
a first conversion circuit, coupled to the current-controlled oscillator, the first conversion circuit being configured to convert a first digital code to the first control current according to a first reference current;
a second conversion circuit, coupled to the current-controlled oscillator and the first conversion circuit, the second conversion circuit being configured to convert a second digital code to the second control current, the first reference current and a second reference current, the second digital code being an accumulation result of a portion of the first digital code, wherein a rate of change of a code value of the second digital code is slower than a rate of change of a code value of the first digital code; and
a third conversion circuit, coupled to the current-controlled oscillator and the second conversion circuit, the third conversion circuit being configured to convert a third digital code and the second reference current to the third control current.

2. The oscillator circuit of claim 1, wherein the portion of the first digital code is at least one most significant bit of the first digital code.

3. The oscillator circuit of claim 1, wherein when a code value of the second digital code increases, each of the first reference current and the second reference current increases.

4. The oscillator circuit of claim 1, wherein an increment in the second control current, generated when the code value of the second digital code is incremented by a predetermined amount, is greater than an increment in the first control current, generated when the code value of the first digital code is incremented by the predetermined amount.

5. The oscillator circuit of claim 1, wherein the third conversion circuit is configured to selectively steer the second reference current from the second conversion circuit to the current-controlled oscillator according to the third digital code, and accordingly generate the third control current.

6. The oscillator circuit of claim 5, wherein the third conversion circuit is configured to increase the third control current by steering the second reference current from the second conversion circuit to the current-controlled oscillator.

7. The oscillator circuit of claim 5, wherein the third conversion circuit is configured to decrease the third control current by stopping steering the second reference current to the current-controlled oscillator.

8. The oscillator circuit of claim 1, wherein the first conversion circuit comprises:
a current mirror circuit, configured to mirror the first reference current to generate an auxiliary current;
a digital-to-analog converter, coupled to the current mirror circuit, the digital-to-analog converter being configured to convert the first digital code to an auxiliary voltage according to the auxiliary current; and
a voltage-to-current converter, coupled to the digital-to-analog converter, the voltage-to-current converter being configured to convert the auxiliary voltage to the first control current.

9. The oscillator circuit of claim 8, wherein the digital-to-analog converter comprises:
a resistor, coupled to a first node, wherein the auxiliary voltage is generated at the first node;
a first transistor, wherein the auxiliary current flows through the first transistor;
N switches, controlled by N bits of the first digital code respectively, the N switches being arranged to selectively couple N second nodes to the first node respectively; and
N second transistors, coupled to the N second nodes respectively, wherein respective N control terminals of the N second transistors are coupled to a control terminal of the first transistor; when one of the N switches is arranged to couple a corresponding second node to the first node, a corresponding second transistor is arranged to provide a current flowing through the switch to the resistor in response to the auxiliary current flowing through the first transistor.

10. The oscillator circuit of claim 1, wherein the second conversion circuit comprises:
a digital-to-analog converter, configured to convert the second digital code to an auxiliary voltage; and
a voltage-to-current converter, coupled to the digital-to-analog converter, the voltage-to-current converter being configured to convert the auxiliary voltage to the first reference current, the second reference current and the second control current.

11. The oscillator circuit of claim 1, wherein respective current levels of the first reference current and the second reference current change in response to a current level of the second control current when the code value of the second digital code is kept unchanged.

12. An oscillator circuit, comprising:
an oscillator, configured to generate an output clock;
a first circuit path, configured to receive a first digital code to generate a first control signal;
a second circuit path, configured to receive a second digital code to generate a second control signal, wherein the second digital code is an accumulation result of a portion of the first digital code, and a rate of change of a code value of the second digital code is slower than a rate of change of a code value of the first digital code; a frequency of the output clock of the oscillator is controlled by the first control signal and the second control signal; and
a third circuit path, configured to receive a third digital code to generate a third control signal, wherein a phase of the output clock of the oscillator is controlled by the third control signal, and respective signal levels of the first control signal, the second control signal and the third control signal are adjusted according to the second digital code.

13. The oscillator circuit of claim 12, wherein the portion of the first digital code is at least one most significant bit of the first digital code.

14. The oscillator circuit of claim 12, wherein an increment in the second control signal, generated when the code value of the second digital code is incremented by a predetermined amount, is greater than an increment in the first control signal, generated when the code value of the first digital code is incremented by the predetermined amount.

15. The oscillator circuit of claim 12, wherein the first circuit path is configured to generate a first control current according to the first digital code and a first reference current, and the first control current serves as the first control signal; the second circuit path is configured to generate a second control current and the first reference current according to the second digital code, and the second control current serves as the second control signal.

16. The oscillator circuit of claim 15, wherein the first circuit path comprises:
a current mirror circuit, configured to mirror the first reference current to generate an auxiliary current;
a digital-to-analog converter, coupled to the current mirror circuit, the digital-to-analog converter being configured to convert the first digital code to an auxiliary voltage according to the auxiliary current; and
a voltage-to-current converter, coupled to the digital-to-analog converter, the voltage-to-current converter being configured to convert the auxiliary voltage to the first control current.

17. The oscillator circuit of claim 15, wherein the second circuit path comprises:
a digital-to-analog converter, configured to convert the second digital code to an auxiliary voltage; and
a voltage-to-current converter, coupled to the digital-to-analog converter, the voltage-to-current converter being configured to convert the auxiliary voltage to the first reference current, the second reference current and the second control current.

18. The oscillator circuit of claim 15, wherein the second circuit path is configured to generate a second reference current according to the second digital code; the third circuit path is configured to generate a third control current by selectively steering the second reference current from the second circuit path to the oscillator according to the third digital code; the third control current serves as the third control signal.

19. The oscillator circuit of claim 18, wherein the third circuit path is configured to increase the third control current by steering the second reference current from the second circuit path to the oscillator.

20. The oscillator circuit of claim 18, wherein the third circuit path is configured to decrease the third control current by stopping steering the second reference current to the oscillator.

* * * * *